(12) United States Patent
Lee et al.

(10) Patent No.: US 8,508,300 B2
(45) Date of Patent: Aug. 13, 2013

(54) CIRCUIT FOR THERMAL PROTECTION IN AUDIO POWER AMPLIFIER AND METHOD THEREOF

(75) Inventors: Kung-Wang Lee, Hsinchu (TW);
Tung-Tsai Liao, Hsinchu (TW)

(73) Assignee: Generalplus Technology Inc., Hsinchu (TW)

( * ) Notice: Subject to any disclaimer, the term of this patent is extended or adjusted under 35 U.S.C. 154(b) by 101 days.

(21) Appl. No.: 13/229,204

(22) Filed: Sep. 9, 2011

(65) Prior Publication Data

US 2012/0086508 A1    Apr. 12, 2012

(30) Foreign Application Priority Data

Oct. 12, 2010  (TW) ................................ 99134659 A

(51) Int. Cl.
*H02H 7/20*    (2006.01)
(52) U.S. Cl.
USPC ......................................... 330/298; 330/289
(58) Field of Classification Search
USPC ....................... 330/298, 207 P, 254, 284, 289
See application file for complete search history.

(56) References Cited

U.S. PATENT DOCUMENTS

| | | | |
|---|---|---|---|
| 5,107,389 A * | 4/1992 | Botti et al. | 361/103 |
| 7,342,455 B2 * | 3/2008 | Behzad et al. | 330/289 |
| 7,705,669 B2 * | 4/2010 | Huang | 330/9 |
| 8,183,927 B2 * | 5/2012 | Mochizuki | 330/289 |
| 2006/0214730 A1 * | 9/2006 | Yamakawa et al. | 330/289 |
| 2006/0226903 A1 * | 10/2006 | Muller et al. | 330/149 |

* cited by examiner

*Primary Examiner* — Henry Choe
(74) *Attorney, Agent, or Firm* — Muncy, Geissler, Olds & Lowe, PLLC

(57) ABSTRACT

The present invention relates to audio amplifier and a method for protecting the audio amplifier. The audio amplifier includes a pre-amp circuit, an output stage power amplifier, a temperature detector and a gain adjusting circuit. The pre-amp circuit receives an audio signal for amplifying the audio signal to generate an amplified audio signal. The output stage power amplifier receives the amplified audio signal to drive a load. The temperature detector is used for detecting a temperature of the output stage power amplifier to output a temperature signal. The gain adjusting circuit adjusts amplitude of the amplified audio signal of the pre-amp circuit according to the temperature signal.

15 Claims, 9 Drawing Sheets

CIRCUIT FOR THERMAL PROTECTION IN AUDIO POWER AMPLIFIER AND METHOD THEREOF

This application claims the benefit of TW Application No. 099134659 filed on Oct. 16, 2010, the content of which is hereby incorporated by reference.

BACKGROUND OF THE INVENTION

1. Field of Invention

The present invention relates in general to an over-temperature protection circuit, and more particularly to a circuit for thermal protection in audio power amplifier and a method thereof.

2. Related Art

The purpose of the audio amplifier is to reconstruct the input audio signal to output to the element for generating audio. The frequency range of the audio is about 20 Hz to 20 KHz. Thus, the audio amplifier must have a good frequency response in the abovementioned frequency range. According to the different applications, the necessary powers of the audio amplifier are greatly different. For example, the application of milli-watts may be earphone, the application of watts may be speaker for TV or PC, the application of tens of watts may be automotive audio system or home theater stereo, and the application of hundreds of watts may be stereo for auditorium hall or Movie Theater.

FIG. 1 illustrates a block diagram depicting an audio amplifier circuit in a conventional art. Referring to FIG. 1, the audio amplifier includes a pre-amplifier 101, an output stage amplifier 102 and a feedback circuit 103. The pre-amplifier 101 is used for amplifying the weak input signal Vin to output an amplified output signal Va. Since the voltage amplified output signal Va still cannot drive the speaker 104, the output stage amplifier 102 is used for performing a current amplifying to the amplified output signal Va such that the speaker 104 can be driven. The feedback circuit 103 is used for increasing the stability of the whole circuit and improving the frequency response according to the principle of negative feedback.

Since there is huge current flowing through the output stage amplifier 102, the power consumption thereof is also huge, the output stage amplifier 102 generally would attach a heat sink. However, the heat sink may not completely absorb the heat generated by the output stage amplifier 102, Thus, the damage of the output stage amplifier 102 commonly occurs when the output stage amplifier 102 is overheat. In order to solve the problem, a temperature detecting mechanism is provided. When the temperature is greater than a threshold, the audio amplifier would be shut down to prevent the damage of the audio amplifier. However, users would have a uncomfortable feeling on user's hearing.

SUMMARY OF THE INVENTION

It is therefore an objective of the present invention to provide a thermal protecting circuit for an audio amplifier such that the damage of the audio amplifier is prevented.

Another objection of the present invention is to provide a audio amplifier such that the uncomfortable feeling on user's hearing can be prevented and also the audio amplifier can be normally operated.

In order to achieve the abovementioned object of the present invention and other object of the present invention, an audio amplifier is provided in the present invention. The audio amplifier comprises a pre-amplifier, an output stage amplifier, a temperature detector and a gain adjusting circuit. The pre-amplifier receives an audio signal for amplifying the audio signal to generate an amplified audio signal. The output stage amplifier is used for receiving the amplified audio signal to output to the load. The temperature detector is used for detecting the temperature of the output stage amplifier to output a temperature signal. The gain adjusting circuit is used for adjusting the amplitude of the amplified audio signal according to the temperature signal.

According to a preferred embodiment of the present invention, the pre-amplifier comprises a differential pair. In addition, in an preferred embodiment, the gain adjusting circuit comprises a adjustable current source coupled to the differential pair and the temperature detector, for adjusting the DC bias supplied to the differential pair according to the temperature signal outputted from the temperature detector.

In another preferred embodiment of the present invention, the gain adjusting circuit comprises an attenuator coupled between the pre-amplifier and the output stage amplifier. The attenuator receives the amplified audio signal from the pre-amplifier for adjusting the amplitude of the amplified audio signal according to the temperature signal outputted from the temperature detector. In the other preferred embodiment of the present invention, the attenuator comprises a transistor and a resistor. The transistor comprises a gate terminal, a first source/drain terminal and a second source/drain terminal, the gate terminal thereof receives the temperature signal, the first source/drain terminal thereof is coupled to the pre-amplifier for receiving the amplified audio signal. The resistor comprises a first terminal and a second terminal. The first terminal of the resistor is coupled to the second source/drain terminal of the transistor. The second terminal of the resistor is coupled to a common voltage.

According to a preferred embodiment of the present invention, the attenuator comprises N transmission gates and N+1 resistor. Each transmission gate respectively comprises an input terminal and an output terminal. Each output terminal thereof is coupled to the output stage amplifier. Each resistor respectively comprises a first terminal and a second terminal. The first terminal of the $1^{st}$ resistor is coupled to the pre-amplifier for receiving the amplified audio signal. The second terminal of the $(N+1)^{th}$ resistor is coupled to a common voltage. The second terminal of the $K^{th}$ resistor is coupled to the first terminal of the $(K+1)^{th}$ resistor. The second terminal of the $K^{th}$ resistor is coupled to the input terminal of the $K^{th}$ transistor. It is determined whether the transmission gates are cut off or not according to the temperature signal, wherein "K" and "N" are nature numbers, and 0<K<=N.

In another preferred embodiment of the present invention, the attenuator comprises an amplifier, a first resistor, N+1 second resistors and N transmission gate. The amplifier comprises a first input terminal, a second input terminal and an output terminal. The first resistor comprises a first terminal and a second terminal. The first terminal of the first resistor is coupled to the pre-amplifier for receiving the amplified audio signal. The second terminal of the first resistor is coupled to the first input terminal of the amplifier. Each second resistor respectively comprises a first terminal and a second terminal. The first terminals of the second resistors are coupled to the first input terminal of the amplifier. The second terminal of the $1^{st}$ second resistor is coupled to the output terminal of the amplifier. Each transmission gate respectively comprises an input terminal and an output terminal. The input terminal of the $K^{th}$ transmission gate is coupled to the second terminal of the $(K+1)^{th}$ second resistor. The output terminals of the transmission gates are coupled to the output terminal of the amplifier. It is determined whether the transmission gates are cut off or not according to the temperature signal, wherein "K" and "N" are nature numbers, and 0<K<=N.

According to a preferred embodiment of the present invention, the temperature detector comprises a thermal couple and an amplifier. The thermal couple comprises a first metal line and a second metal line, wherein the first terminal of the first metal line is coupled to the first terminal of the second metal line. The first terminal of the first metal line is coupled to the output stage amplifier. The amplifier is coupled to the second terminals of the first metal line and the second metal line to output the temperature signal.

An integrated audio amplifier is also provided in the present invention. The audio amplifier comprises a pre-amplifier, an output stage amplifier, a temperature detector and a gain adjusting circuit. The pre-amplifier receives an audio signal for amplifying the audio signal to generate an amplified audio signal. The output stage amplifier is used for receiving the amplified audio signal to output to the load. The temperature detector is used for detecting the temperature of the output stage amplifier to output a temperature signal. The gain adjusting circuit is used for adjusting the amplitude of the amplified audio signal according to the temperature signal, wherein the pre-amplifier, the output stage amplifier, the temperature detector and the gain adjusting circuit is integrated into a same integrated circuit.

According to a preferred embodiment of the present invention, the temperature detector comprises a diode, a reference voltage generator and an amplifier. The diode comprises an anode terminal and a cathode terminal. The anode terminal thereof is coupled to a bias. The cathode terminal thereof is coupled to a common voltage. The diode is disposed nearby the heat source of the integrated audio amplifier. The reference voltage generator is used for generating a reference voltage. The amplifier comprises a first input terminal, a second input terminal and an output terminal. The first input terminal thereof is coupled to the anode terminal of the diode. The second input terminal thereof is coupled to the reference voltage generator for receiving the reference voltage. The output terminal thereof is used for outputting the temperature. In a further embodiment, the reference voltage generator comprises a band-gap reference circuit.

A method for protecting an audio amplifier is further provided in the present invention. The method comprises the steps of: (a) detecting a temperature of a heat source of the audio amplifier; (b) determining whether the temperature is greater than a temperature threshold; (c) returning to step (b) when the temperature is smaller than the temperature threshold; and (d) adaptively adjusting an amplitude of an output signal of the audio amplifier according to value of the temperature when the temperature is greater than the temperature threshold, wherein the higher the value of the temperature is, the smaller the amplitude of the output signal of the audio amplifier is adjusted.

The spirit of the present invention is to integrate the gain adjusting mechanism and the temperature protect. When the temperature is greater than a preset threshold, the gain would be reduced with the increment of the temperature, such that the audio interrupt is avoided and the uncomfortable feeling on user's hearing can be reduced.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE INVENTION

The present invention will be apparent from the following detailed description, which proceeds with reference to the accompanying drawings, wherein the same references relate to the same elements.

The First Embodiment

Figure 1:
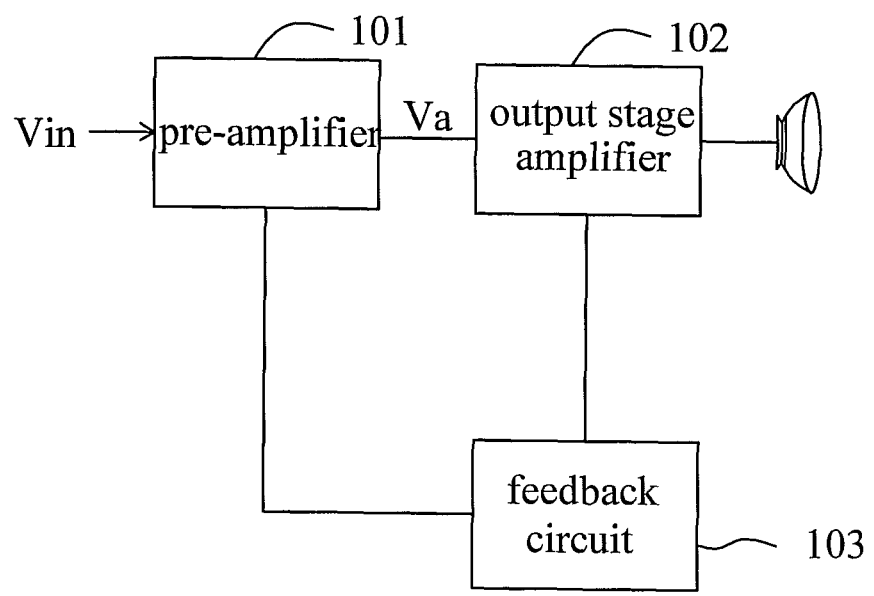
FIG. 1 illustrates a block diagram depicting an audio amplifier circuit in a conventional art.
Figure 2:
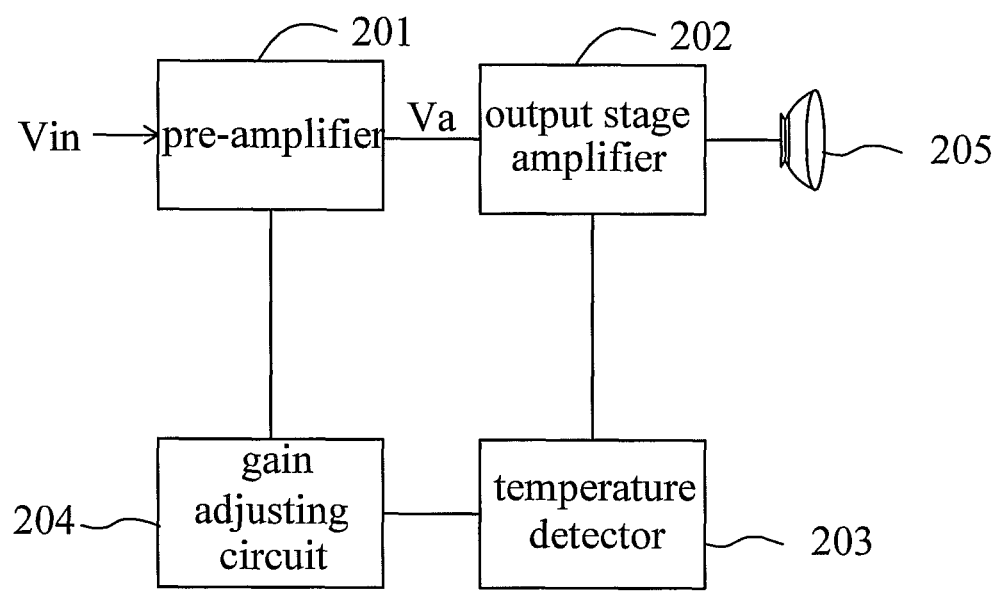
FIG. 2 illustrates a circuit diagram depicting an audio amplifier with a built-in thermal protecting circuit according to a first embodiment of the present invention.

FIG. 2 illustrates a circuit diagram depicting an audio amplifier with a built-in thermal protecting circuit according to a first embodiment of the present invention. Referring to FIG. 2, the audio amplifier includes a pre-amplifier 201, an output stage amplifier 202, a temperature detector 203 and a gain adjusting circuit 204. The pre-amplifier 201 receives an audio signal Vin for amplifying the audio signal to generate an amplified audio signal Va. The output stage amplifier 202 receives the amplified audio signal Va for driving the loading 205, such as speaker. The temperature detector 203 is used for detecting the temperature of the output stage amplifier 202 to output a temperature signal. Since the output stage amplifier 203 is used for driving the load such that the power consumption thereof is relatively greater than that of the other circuits in the audio amplifier. Thus, the main heat source of the audio amplifier would be the output stage amplifier 203. The gain adjusting circuit 204 is used for adjusting the gain of the pre-amplifier 201 according to the temperature signal.

The higher the temperature is, the smaller the gain of the pre-amplifier 201 is adjusted. The current outputting from the output stage amplifier 202 flowing through the load 205 is also smaller, and the volume heard by user is lower as well. With the temperature rising, the volume is gradually decreased instead of the instantaneously shutdown. When the temperature decreases, the gain would be up-regulated. Thus, the volume is gradually increased. Since the volume does not instantaneously shutdown, the uncomfortable feeling on user's hearing can be avoided.

General speaking, the mechanism of the gain adjusting circuit 204 and the temperature detector 203 can be regarded as an AGC (Auto Gain Control) circuit. The AGC circuit can be divided into two part, that is, the gain control circuit, such as the gain adjusting circuit 204 of the present invention, and the control signal generating circuit, such as the temperature detector 203. The following embodiments would further describe the abovementioned two circuits.

The Second Embodiment

Figure 3:
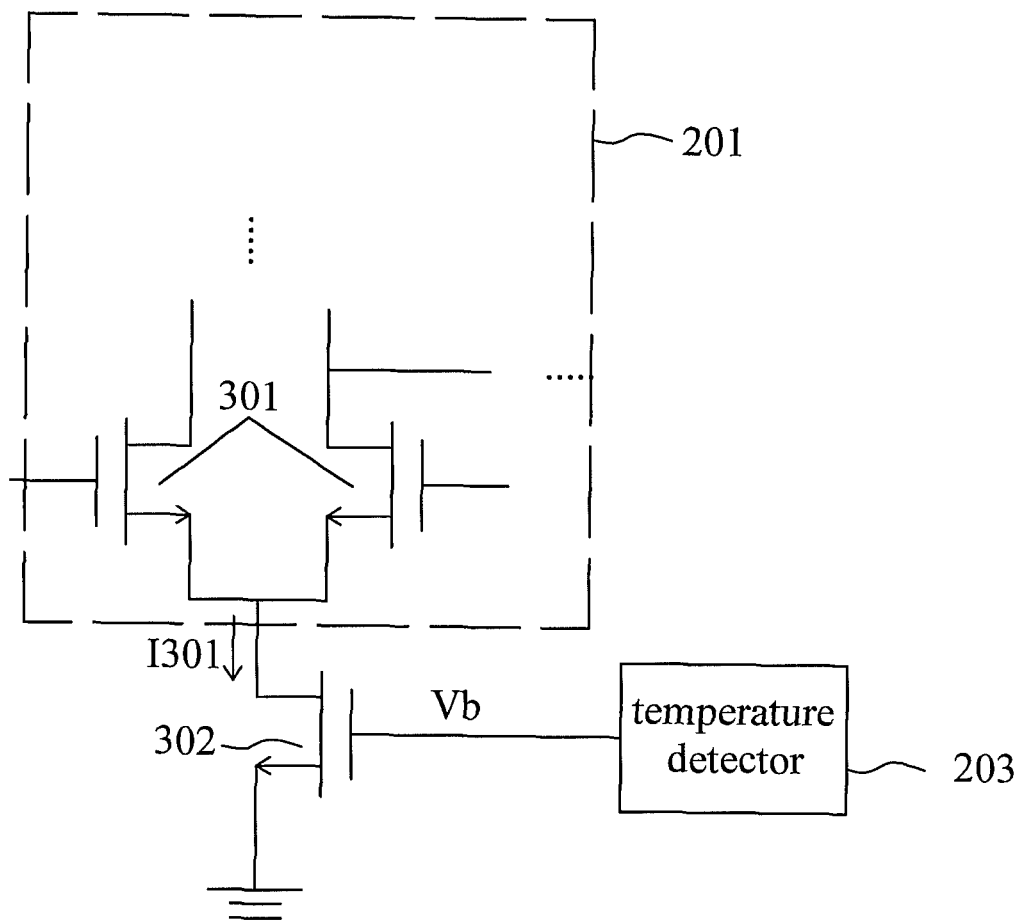
FIG. 3 illustrates a circuit diagram depicting an audio amplifier with a built-in thermal protecting circuit according to a second embodiment of the present invention.

FIG. 3 illustrates a circuit diagram depicting an audio amplifier with a built-in thermal protecting circuit according to a second embodiment of the present invention. Referring to FIG. 3, this embodiment discloses the detail circuit of the first embodiment, wherein the pre-amplifier 201 is only illustrated the inputs of the differential pair, the adjustable current source 302 is used for example of the gain adjusting circuit 204. In this embodiment, the adjustable current source 302 is implemented by a N-type MOSFET (Metal Oxide Semiconductor Field Effect Transistor). According to the circuit disclosed in this embodiment, the gain of the pre-amplifier 201 is determined by the trans-conductor (gm). The current I301 is adjusted, and the trans-conductor (gm) is also adjusted, and the gain of whole circuit is therefore adjusted. Thus, in the present embodiment, when the temperature is increased, the voltage Vb is decreased as the increasing of the temperature, and the current I301 is decreased, and then the gain of the pre-amplifier 201 is decreased as well.

The Third Embodiment

Figure 4:
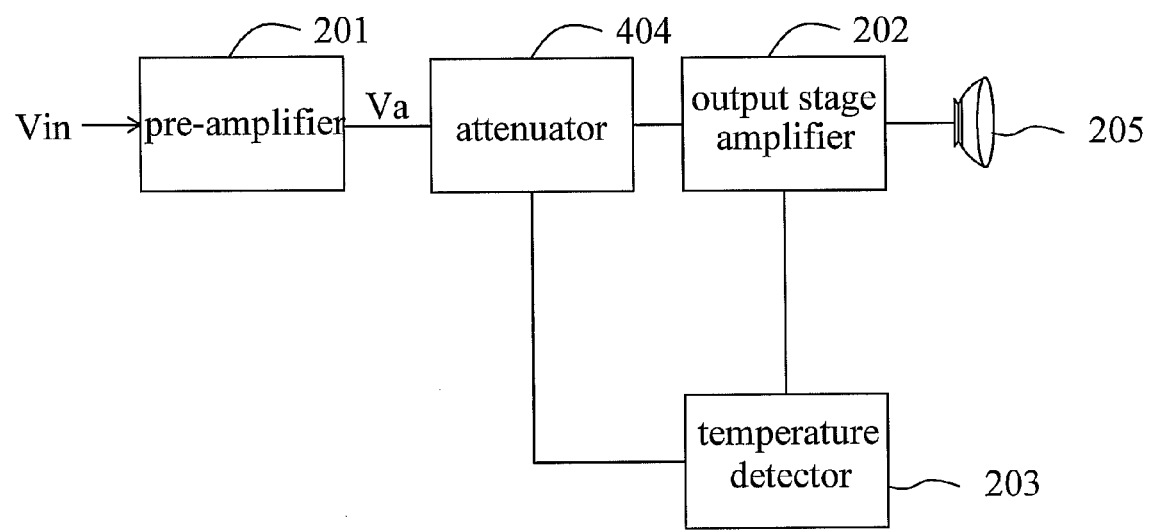
FIG. 4 illustrates a circuit diagram depicting an audio amplifier with a built-in thermal protecting circuit according to a third embodiment of the present invention.

FIG. 4 illustrates a circuit diagram depicting an audio amplifier with a built-in thermal protecting circuit according to a third embodiment of the present invention. Referring to FIG. 4, the difference between FIG. 4 and FIG. 2 is that the gain adjusting circuit 204 is coupled between the pre-amplifier 201 and the output stage amplifier 202, and the gain adjusting circuit 204 is implemented as an attenuator 404. the purpose of the design mainly is to attenuating the amplitude of the amplified audio signal Va outputting from the pre-amplifier 201. When the temperature increases, the amplitude of the signal Va would be reduced such that the output stage amplifier 202 drives the speaker 205 with smaller driving current. Since the driving current is reduced, the temperature would thereby reduce.

The Fourth Embodiment

Figure 5:
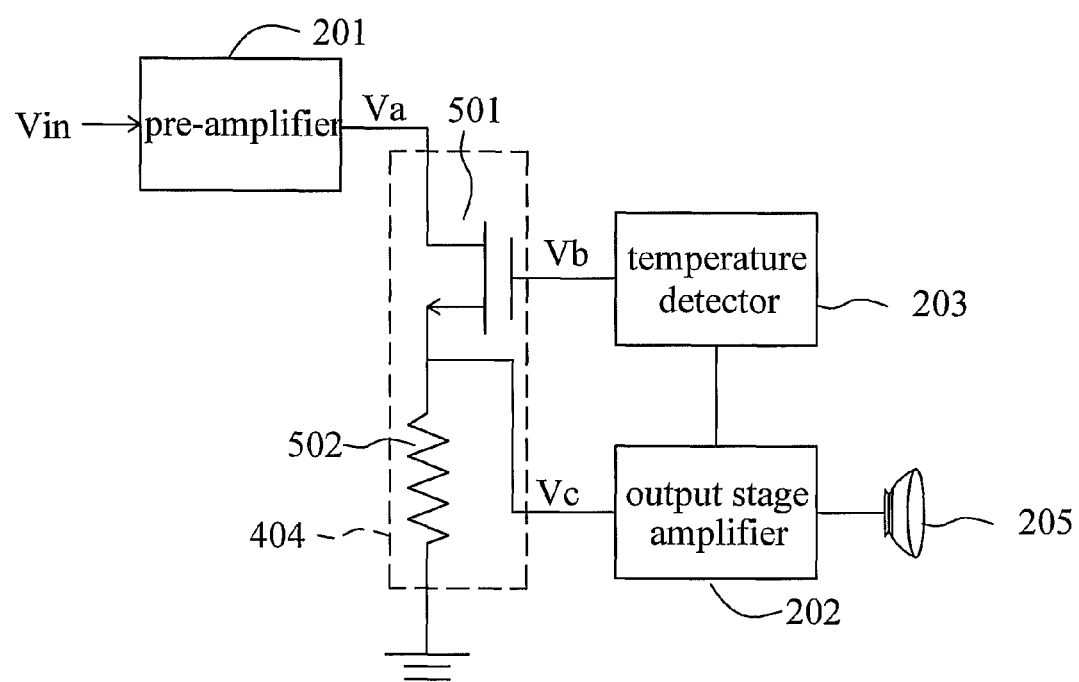
FIG. 5 illustrates a circuit diagram depicting the attenuator 404 of an audio amplifier with a built-in thermal protecting circuit according to a fourth embodiment of the present invention.

FIG. 5 illustrates a circuit diagram depicting the attenuator 404 of an audio amplifier with a built-in thermal protecting circuit according to a fourth embodiment of the present invention. Referring to FIG. 5, the attenuator 404 is implemented by a transistor 501 and a resistor 502. When the temperature increases, the voltage of the output signal Vb of the temperature detector 203 would be reduced. Since the transistor 501 is similar to a voltage control resistance, the voltage of the signal Vb reduces, the voltage control resistance 501 would increase, the signal Va would attenuate to serve as the signal Vc by the resistance voltage divider implemented by the transistor 501 and the resistor 502.

The Fifth Embodiment

Figure 6:
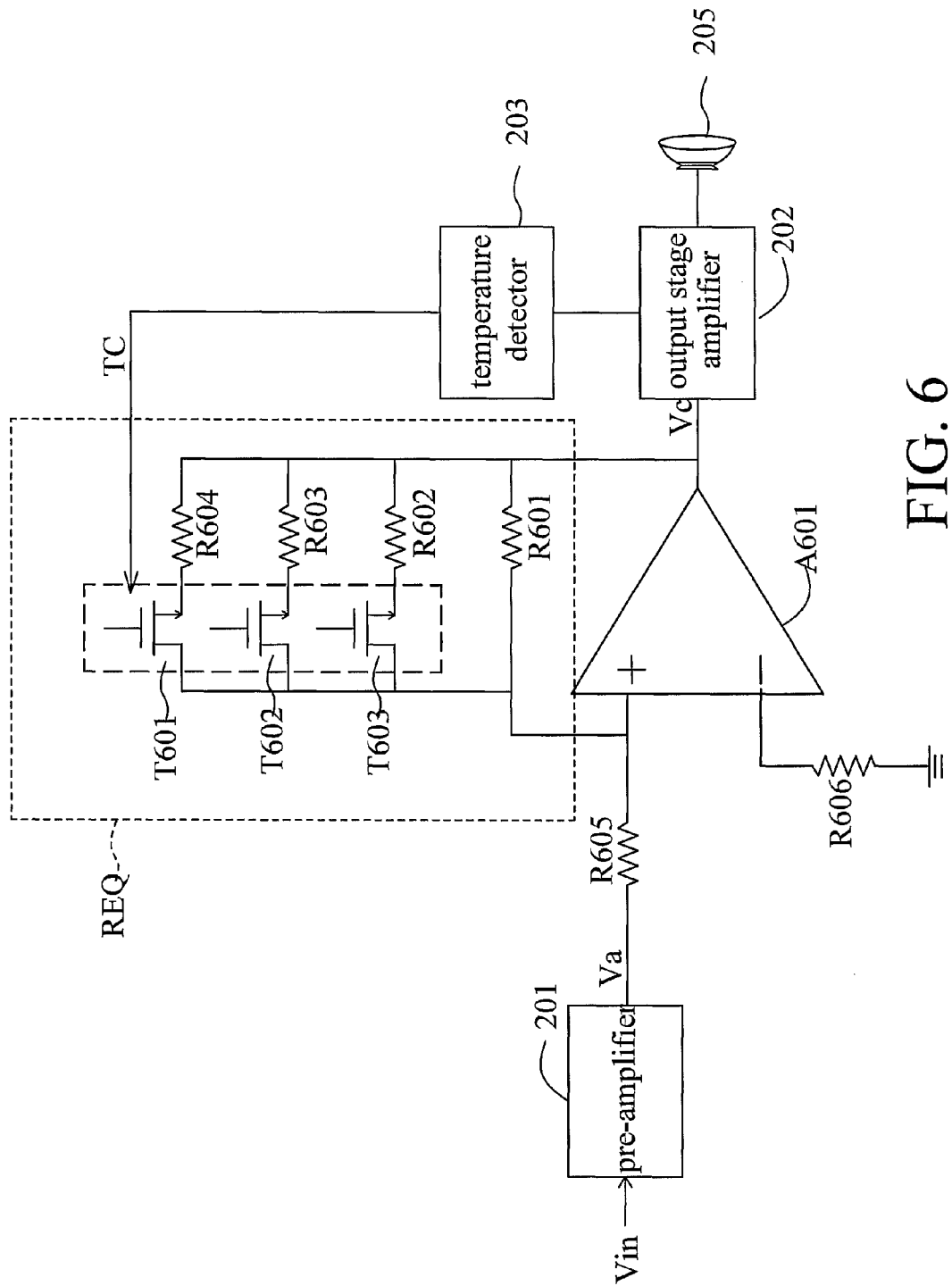
FIG. 6 illustrates a circuit diagram depicting the attenuator 404 of an audio amplifier with a built-in thermal protecting circuit according to a fifth embodiment of the present invention.

FIG. 6 illustrates a circuit diagram depicting the attenuator 404 of an audio amplifier with a built-in thermal protecting circuit according to a fifth embodiment of the present invention. Referring to FIG. 6, the attenuator 404 is implemented by an amplifier A601, a first transistor T601, a second transistor T602, a third transistor T603, a first resistor R601, a second resistor R602, a third resistor R603, a fourth resistor R604, a fifth resistor R605 and a sixth resistor R606. In this embodiment, the first transistor T601, the second transistor T602 and the third transistor T603 are served as switches. The temperature detector 203 uses the temperature control signal TC to control whether the first transistor T601, the second transistor T602 and the third transistor T603 are respectively cut off or not. People having ordinary skill in the art should know that the temperature detector 203 would be respectively coupled to the gate terminals of the first transistor T601, the second transistor T602 and the third transistor T603 in a practical circuit implementation. In this embodiment, the abovementioned coupling relationship does not show in the FIG. 6.

The temperature control signal TC outputted from the temperature detector 203 can be designed, such as a signal of a digital circuit. The higher the temperature is, the more the transistors T601, T602 and T603 may be conducted. The gain of the attenuator 404 in this embodiment can be approximated as the following equation:

$$A \approx REQ/R605$$

wherein REQ represents the equivalent resistance constituted by the first transistor T601, the second transistor T602, the third transistor T603, the first resistor R601, the second resistor R602, the third resistor R603, the fourth resistor R604, the fifth resistor R605 and the sixth resistor R606. The smaller the equivalent resistance REQ is, the smaller the gain is. The higher the temperature is, the more the transistors T601, T602 and T603 may be conducted such that the equivalent resistance REQ would be reduced thereby. Thus, the amplitude of the output signal Vc would be reduced as the temperature.

Although, the shunting circuit implemented by three transistors T601, T602 and T603 respectively coupling to three resistors R601, R602 and R603 is used for example, people having ordinary skill in the art should know that the number of transistors and resistors can be changed according to the different designs. Thus, the present invention is not limited thereto. Moreover, people having ordinary skill in the art should know the N-type transistors T601, T602 and T603 can be replaced by transmission gates or P-type transistors, the detail description is omitted.

The Sixth Embodiment

Figure 7:
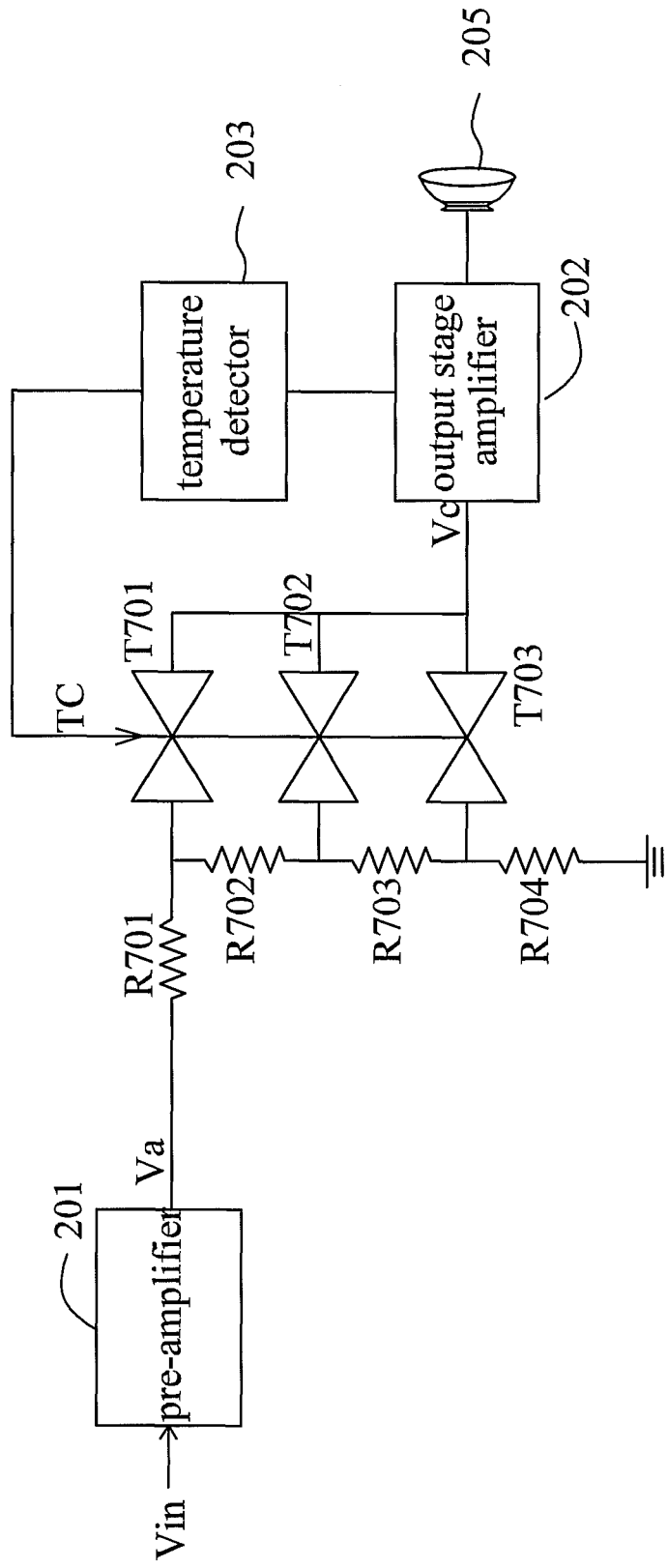
FIG. 7 illustrates a circuit diagram depicting the attenuator 404 of an audio amplifier with a built-in thermal protecting circuit according to a sixth embodiment of the present invention.

FIG. 7 illustrates a circuit diagram depicting the attenuator 404 of an audio amplifier with a built-in thermal protecting circuit according to a sixth embodiment of the present invention. Referring to FIG. 7, in this embodiment, the attenuator 404 is implemented by a first transmission gate T701, a second transmission gate T702, a third transmission gate T703, a first resistor R701, a second resistor R702, a third resistor R703 and a fourth resistor R704. The coupling relationship thereof is illustrated as shown FIG. 7. People having ordinary skill in the art should know that the temperature detector 203 would be respectively coupled to the first transmission gate T701, the second transmission gate T702 and the third transmission gate T703 in a practical circuit implementation. Similarly, the temperature control signal TC outputted from the temperature detector 203 can be designed, such as a signal of a digital circuit. The difference between the fifth embodiment and the sixth embodiment is that the transistors T601, T602 and T603 can be conducted at the same time. However, for the convenience of design, in the sixth embodiment, only the selected one of the transmission gate T701, T702 and T703 can be conducted at the same time.

For conveniently describing the present embodiment, assuming there are three threshold of the temperature T1, T2 and T3, and T3>T2>T1.

When the temperature is lower than the first preset temperature T1, only the first transmission gate T701 is conducted, and $$Vc=Va\times(R702+R703+R704)/(R701+R702+R703+R704)$$

When the temperature is increased between the first preset temperature T1 and the second preset temperature T2, the first transmission gate T701 is cut off and the second transmission gate is conducted, and $$Vc=Va\times(R703+R704)/(R701+R702+R703+R704)$$

When the temperature is increased between the second preset temperature T2 and the third preset temperature T3, the second transmission gate T702 is cut off and the third transmission gate R703 is conducted, and $$Vc=Va\times(R704)/(R701+R702+R703+R704)$$

According to the abovementioned embodiment, the higher the temperature is, the smaller the signal Vc receiving by the output stage amplifier 202 is. Thus, the temperature can be adaptively controlled in a preset range. The abovementioned embodiment uses the transmission gate T701, T702 and T703 for example. However, people having ordinary skill in the art should know that the transmission gates are served as switch. Any element having the function as switch, such as transistor, can be used for replacing the transmission gates. Moreover, the embodiment only uses three transmission gates, people having ordinary skill in the art should know that the number of transmission gates and resistors can be changed according to the different designs. Thus, the present invention is not limited thereto.

The Seventh Embodiment

Figure 8:
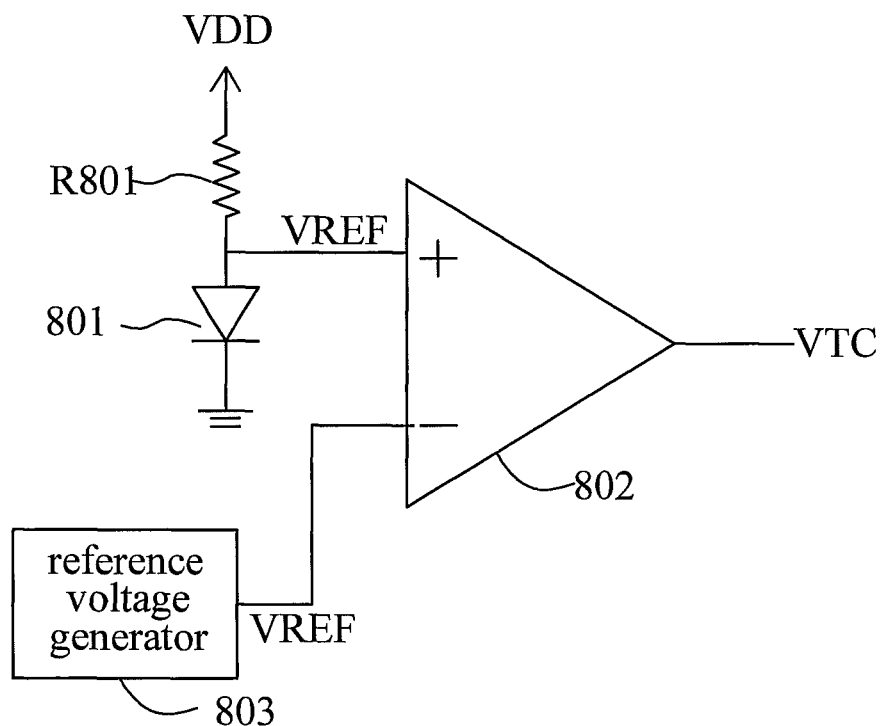
FIG. 8 illustrates a circuit diagram depicting an integrated audio amplifier with a built-in thermal protecting circuit according to a seventh embodiment of the present invention.

In order to integrate the temperature detector 203 with the pre-amplifier 201, the output stage amplifier 202 and the gain adjusting circuit 204 into an IC, an integrated audio amplifier is provided in the seventh embodiment. The integrated audio amplifier integrated the temperature detector 203, the pre-amplifier 201, the output stage amplifier 202 and the gain adjusting circuit 204 into the same IC. FIG. 8 illustrates a circuit diagram depicting an integrated audio amplifier with a built-in thermal protecting circuit according to a seventh embodiment of the present invention. Referring to FIG. 8, in this embodiment, the temperature detector 203 is implemented by a resistor R801, a diode 801, an amplifier 802 and a reference voltage generator 803, wherein the diode 801 is disposed near the output stage amplifier 202. The barrier potential of the diode 801 is varied as the temperature. For example, when the temperature increases one degree in centigrade, the barrier potential of the diode made by silicon would reduce 2.5 mV.

Moreover, in order that the temperature signal VTC can be varied as the temperature precisely, the reference voltage output by the reference voltage generator 803 is implemented by the band-gap voltage reference circuit. The reference voltage VREF generated by the band-gap voltage reference circuit would hardly varied as the temperature. The implementation of the temperature detector 203 uses that the amplifier 802 amplifies the voltage difference between the barrier potential of the diode 801, which is varied as the temperature, and the reference voltage VREF, which is not varied as the temperature.

The temperature detector 203 of the seventh embodiment can be used to control the gain adjust circuit of the second embodiment or the attenuator of the fourth embodiment. If the temperature detector 203 of the seventh embodiment has to control the attenuator in the fifth embodiment or the sixth embodiment, the extra analog to digital converter should be designed such that the temperature signal VTC coverts to a digital signal to control the switches of the fifth embodiment or the sixth embodiment.

The Eighth Embodiment

Figure 9:
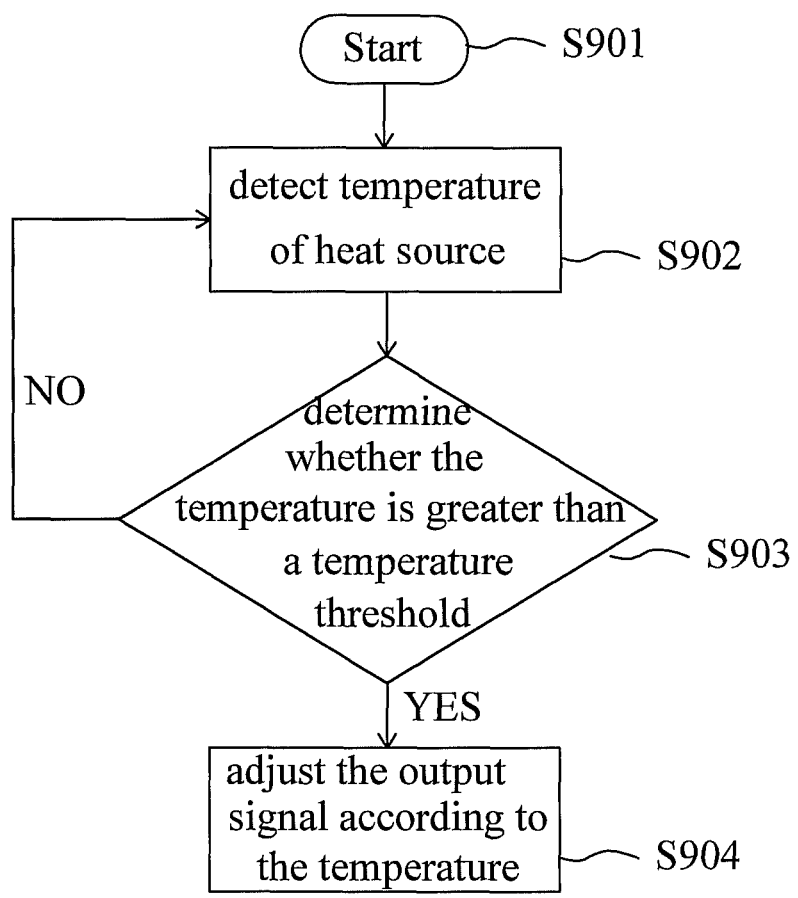
FIG. 9 illustrates a flowchart depicting a method for protecting an audio amplifier according to a eighth embodiment of the present invention.

According to the abovementioned embodiments, the method for protecting an audio amplifier can be generalized. FIG. 9 illustrates a flowchart depicting a method for protecting an audio amplifier according to an eighth embodiment of the present invention. Referring to FIG. 9, the method includes the steps of:

In step S901, the method starts.

In step S902, the temperature of the heat source of the audio amplifier is detected.

In step S903, it is determined whether the temperature is greater than a temperature threshold. When the temperature is smaller than the temperature threshold, return to step S902 to detect the temperature. When the temperature is greater than the temperature threshold, execute the step S904.

In step S904, the amplitude of the output signal of the audio amplifier is adjusted according to the temperature, wherein the higher the temperature is, the smaller the amplitude of the output signal of the audio amplifier is adjusted.

In summary, the spirit of the present invention is to integrate the gain adjusting mechanism and the temperature protect. When the temperature is greater than a preset threshold, the gain would be reduced with the increment of the temperature, such that the audio interrupt is avoided and the uncomfortable feeling on user's hearing can be reduced.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. An audio amplifier, comprising:
   a pre-amplifier, receiving and amplifying an audio signal for generating an amplified audio signal, wherein the pre-amplifier comprises a differential pair;
   an output stage amplifier, receiving the amplified audio signal and output to a load;
   a temperature detector, detecting the temperature of the output stage amplifier for outputting a temperature signal; and a gain adjusting circuit, for adjusting an amplitude of the amplified audio signal outputted from the pre-amplifier according to the temperature signal, wherein the gain adjusting circuit comprises an adjustable current source, coupled to the differential pair and the temperature detector, for adjusting the direct current bias supplied to the differential pair according to the temperature signal outputted from the temperature detector.

2. The audio amplifier according to claim 1, wherein the temperature detector comprises:
   a thermal couple, comprising a first metal line and a second metal line, wherein a first terminal of the first metal line is coupled to a first terminal of the second metal line, wherein the first terminal of the first metal line is coupled to the output stage amplifier; and
   an amplifier, coupled to a second terminal of the first metal line and a second terminal of the second metal line, for outputting the temperature signal.

3. An audio amplifier comprising:
   a pre-amplifier, having an output terminal, receiving and amplifying an audio signal for generating an amplified a audio signal, wherein the preamplifier outputs the amplified audio signal from the output terminal;
   an output stage amplifier, having an input terminal, wherein the output stage amplifier is used for driving a load;
   a temperature detector, detecting the temperature of the output stage amplifier for outputting a temperature signal; and
   a gain adjusting circuit, for adjusting an amplitude of the amplified audio signal outputted from the pre-amplifier according to the temperature signal, wherein the gain adjusting circuit comprises an attenuator,
   wherein the attenuator has an input terminal and an output terminal, the input terminal of the attenuator is coupled to the output terminal of the pre-amplifier and the output terminal of the attenuator is coupled to the input terminal of the output stage amplifier,
   wherein the input terminal of the attenuator receives the amplified audio signal from the output terminal of the pre-amplifier for adjusting the amplitude of the amplified audio signal according to the temperature signal outputted from the temperature detector and then the attenuator outputs the attenuated amplified audio signal to the input terminal of the output stage amplifier, wherein the higher the temperature is, the smaller an amplitude of the amplified audio signal is adjusted by the attenuator.

4. The audio amplifier according to claim 3, wherein the attenuator comprises:
   a transistor, comprising a gate terminal, a first drain/source terminal and a second drain/source terminal, wherein the gate terminal thereof receives the temperature signal, the first drain/source terminal is coupled to the pre-amplifier for receiving the amplified audio signal; and
   a resistor, comprising a first terminal and a second terminal, wherein the first terminal thereof is coupled to the second drain/source terminal, and the second terminal thereof is coupled to a common voltage.

5. The audio amplifier according to claim 3, wherein the attenuator comprises:
   N transmission gates, wherein each transmission gate respectively comprises an input terminal and an output terminal, and each output terminal is coupled to the output stage amplifier; and
   N+1 resistors, wherein each resistor comprises a first terminal and a second terminal, wherein the first terminal of the 1st resistor is coupled to the pre-amplifier for receiving the amplified audio signal, the second terminal of the (N+1)th resistor is coupled to a common voltage, the second terminal of the Kth resistor is coupled to the first terminal of the (K+1)th resistor, and the second terminal of the Kth resistor is coupled to the input terminal of the Kth transmission gate,
   wherein the temperature signal is used for determining whether each transmission gate is respectively cut off or not,
   wherein, "K" and "N" are nature numbers, and 0<K<=N.

6. The audio amplifier according to claim 3, wherein the attenuator comprises:
   an amplifier, comprising a first input terminal, a second input terminal and an output terminal;
   a first resistor, comprising a first terminal and a second terminal, wherein the first terminal thereof is coupled to the pre-amplifier for receiving the amplified audio signal, the second terminal thereof is coupled to the first input terminal of the amplifier;
   N+1 second resistors, wherein each second resistor respectively comprises a first terminal and a second terminal, each first terminal of the second resistors is coupled to the first input terminal of the amplifier, the second terminal of the 1st second resistor is coupled to the output terminal of the amplifier;
   N transmission gates, wherein each transmission gate respectively comprises an input terminal and an output terminal, wherein the input terminal of the Kth transmission gate is coupled to the second terminal of the (K+1)th second resistor, the output terminals of each transmission gate are coupled to the output terminal of the amplifier,
   wherein the temperature signal is used for determining whether the transmission gates respectively are cut off or not,
   wherein, "K" and "N" are nature numbers, and 0<K<=N.

7. The audio amplifier according to claim 3, wherein the temperature detector comprises:
   a thermal couple, comprising a first metal line and a second metal line, wherein a first terminal of the first metal line is coupled to a first terminal of the second metal line, wherein the first terminal of the first metal line is coupled to the output stage amplifier; and
   an amplifier, coupled to a second terminal of the first metal line and a second terminal of the second metal line, for outputting the temperature signal.

8. An integrated audio amplifier, comprising:
   a pre-amplifier, receiving and amplifying an audio signal for generating an amplified audio signal, wherein the pre-amplifier comprises a differential pair;
   an output stage amplifier, receiving the amplified audio signal and output to a load;
   a temperature detector, detecting the temperature of the output stage amplifier for outputting a temperature signal; and
   a gain adjusting circuit, for adjusting an amplitude of the amplified audio signal outputted from the pre-amplifier according to the temperature signal,
   wherein the pre-amplifier, the output stage amplifier, the temperature detector and the gain adjusting circuit are integrated into a same integrated circuit, wherein the gain adjusting circuit comprises an adjusting current source, coupled to the differential pair and the temperature detector, for adjusting the direct current bias supplied to the differential pair according to the temperature signal outputted from the temperature detector.

9. The integrated audio amplifier according to claim 8, wherein the temperature sensor comprises:
- a diode, comprising an anode terminal and a cathode terminal, wherein the anode terminal thereof is coupled to a bias, a cathode terminal is coupled to a common voltage, wherein the diode is disposed nearby a heat source of the output stage amplifier;
- a reference voltage generator, for generating a reference voltage;
- a amplifier, comprising a first input terminal, a second input terminal and an output terminal, wherein the first input terminal thereof is coupled to the anode terminal of the diode, the second input terminal thereof is coupled to the reference voltage generator for receiving the reference voltage, the output terminal thereof is used for outputting the temperature signal.

10. An integrated audio amplifier, comprising:
- a pre-amplifier, having an output terminal, receiving and amplifying an audio signal for generating an amplified audio signal, wherein the preamplifier outputs the amplified audio signal from the output terminal;
- an output stage amplifier, having an input terminal, wherein the output stage amplifier is used for driving a load;
- a temperature detector, detecting the temperature of the output stage amplifier for outputting a temperature signal; and
- a gain adjusting circuit, for adjusting an amplitude of the amplified audio signal outputted from the pre-amplifier according to the temperature signal, wherein the gain adjusting circuit comprises an attenuator, wherein the attenuator has an input terminal and an output terminal, the input terminal of the attenuator is coupled to the output terminal of the pre-amplifier and the output terminal of the attenuator is coupled to the input terminal of the output stage amplifier, wherein the input terminal of the attenuator receives the amplified audio signal from the output terminal of the pre-amplifier for adjusting the amplitude of the amplified audio signal according to the temperature signal outputted from the temperature detector and then the attenuator outputs the attenuated amplified audio signal to the input terminal of the output stage amplifier, where the higher the temperature is, the smaller an amplitude of the amplified audio signal is adjusted by the attenuator.

11. The audio amplifier according to claim 10, wherein the attenuator comprises:
- a transistor, comprising a gate terminal, a first drain/source terminal and a second drain/source terminal, wherein the gate terminal thereof receives the temperature signal, the first drain/source terminal is coupled to the pre-amplifier for receiving the amplified audio signal; and
- a resistor, comprising a first terminal and a second terminal, wherein the first terminal thereof is coupled to the second drain/source terminal, and the second terminal thereof is coupled to a common voltage.

12. The audio amplifier according to claim 10, wherein the attenuator comprises:
- N transmission gates, wherein each transmission gate respectively comprises an input terminal and an output terminal, and each output terminal thereof is coupled to the output stage amplifier; and
- N+1 resistors, wherein each resistor comprises a first terminal and a second terminal, wherein the first terminal of the 1st resistor is coupled to the pre-amplifier for receiving the amplified audio signal, the second terminal of the (N+1)th resistor is coupled to a common voltage, the second terminal of the Kth resistor is coupled to the first terminal of the (K+1)th resistor, and the second terminal of the Kth resistor is coupled to the input terminal of the Kth transmission gate, wherein the temperature signal is used for determining whether each transmission gates is respectively cut off or not, wherein, "K" and "N" are nature numbers, and 0<K<=N.

13. The audio amplifier according to claim 10, wherein the attenuator comprises:
- an amplifier, comprising a first input terminal, a second input terminal and an output terminal;
- a first resistor, comprising a first terminal and a second terminal, wherein the first terminal thereof is coupled to the pre-amplifier for receiving the amplified audio signal, the second terminal thereof is coupled to the first input terminal of the amplifier;
- N+1 second resistors, wherein each second resistor respectively comprises a first terminal and a second terminal, each first terminal of the second resistors is coupled to the first input terminal of the amplifier, the second terminal of the 1st second resistor is coupled to the output terminal of the amplifier;
- N transmission gates, wherein each transmission gate respectively comprises an input terminal and an output terminal, wherein the input terminal of the Kth transmission gate is coupled to the second terminal of the (K+1)th second resistor, the output terminals of each transmission gate are coupled to the output terminal of the amplifier, wherein the temperature signal is used for determining whether the transmission gates are respectively cut off or not, wherein, "K" and "N" are nature numbers, and 0<K<=N.

14. The audio amplifier according to claim 10, wherein the temperature detector comprises:
- a diode, comprising an anode terminal and a cathode terminal, wherein the anode terminal thereof is coupled to a bias, a cathode terminal is coupled to a common voltage, wherein the diode is disposed nearby a heat source of the output stage amplifier;
- a reference voltage generator, for generating a reference voltage;
- a amplifier, comprising a first input terminal, a second input terminal and an output terminal, wherein the first input terminal thereof is coupled to the anode terminal of the diode, the second input terminal thereof is coupled to the reference voltage generator for receiving the reference voltage, the output terminal thereof is used for outputting the temperature signal.

15. The audio amplifier according to claim 14, wherein the reference voltage generator comprises a band-gap reference circuit.

* * * * *